United States Patent [19]

Kawashima et al.

[11] Patent Number: 5,418,760
[45] Date of Patent: May 23, 1995

[54] ELECTRONIC DEVICES WITH A LIQUID CRYSTAL DISPLAY

[75] Inventors: Kazuyo Kawashima, Tachikawa; Yoshimi Ishikawa, Hamura, both of Japan

[73] Assignee: Casio Computer Co., Ltd., Tokyo, Japan

[21] Appl. No.: 101,714

[22] Filed: Aug. 2, 1993

[30] Foreign Application Priority Data

Aug. 18, 1992 [JP] Japan .................................. 4-241303
Dec. 28, 1992 [JP] Japan .................................. 4-360073

[51] Int. Cl.⁶ ...................... G04C 17/00; G04C 19/00; G06F 3/14
[52] U.S. Cl. .............................. 368/69; 368/82; 368/242; 341/23; 345/173
[58] Field of Search ................ 368/10, 69–70, 368/82, 239, 242, 319–321; 340/711, 712; 341/22, 23

[56] References Cited

U.S. PATENT DOCUMENTS

| | | |
|---|---|---|
| 3,803,634 | 4/1974 | Reese . |
| 4,074,118 | 2/1978 | Washizuka et al. .................. 364/712 |
| 4,078,257 | 3/1978 | Bagley .................................. 364/900 |
| 4,274,093 | 4/1981 | Judge .................................... 340/712 |
| 4,516,112 | 5/1985 | Chen .................................. 340/365 R |

*Primary Examiner*—Vit W. Miska
*Attorney, Agent, or Firm*—Frishauf, Holtz, Goodman & Woodward

[57] ABSTRACT

An electronic device including a switch member which has a multiplicity of switch contacts provided thereon, a film liquid crystal display unit disposed above the switch member and having openings provided at positions opposite to the respective switch contacts, and operation members disposed in the corresponding openings so as to depress the operation members from above the film liquid crystal display. By the depression of the respective operation members, the corresponding switch contacts are switched. According to this structure, the switching operations are performed on the film liquid crystal display unit, so that the operability of the switches is improved and the device itself is miniaturized.

16 Claims, 9 Drawing Sheets

ELECTRONIC DEVICES WITH A LIQUID CRYSTAL DISPLAY

BACKGROUND OF THE INVENTION

1. Field of the Invention

This invention relates to electronic devices with a liquid crystal display which displays various data.

2. Background Art

Recently, electronic devices which use a film liquid crystal unit as a display have appeared as articles to reduce the thickness of the devices. The film liquid crystal unit of this type has two electrodes formed on the corresponding opposite surfaces of two transparent flexible plates between which a liquid crystal material is confined.

In such electronic device with the film liquid crystal unit, the liquid crystal unit is disposed on top of the device housing, and operation keys which change the contents of display in the liquid crystal unit and the mode of display, and set data are disposed around the liquid crystal unit.

In such electronic device where the operation keys and the film liquid crystal unit are juxtaposed, an increase in the size of the film crystal unit would accordingly require reduction in the size of the operation keys, which would deteriorate the operability of the device.

SUMMARY OF THE INVENTION

It is therefore an object of the present invention to provide an electronic device with a miniaturized liquid crystal display unit improved in operability.

In order to achieve the above object, according to the present invention, there is provided an electronic device comprising:

a device casing having a through hole therein;

an operation button disposed in the through hole in the casing;

a switch member disposed below the operation button and switched by the depression of the button; and a film liquid crystal display unit disposed around the periphery of the operation button and having the contents of display thereof controlled by the switching operation of the switch member.

BRIEF DESCRIPTION OF THE DRAWINGS

FIG. 1 is a perspective view of an electronic device to which the present invention is applied;

FIG. 2 is a cross-sectional view taken along the line II—II of FIG. 1;

FIG. 3 is an enlarged cross-sectional view of a circled portion of FIG. 2;

FIG. 4 is a plan view of a film liquid crystal display unit used in the electronic device;

FIG. 5 is a plan view of an illustrative display in the display unit;

FIG. 6 is a plan view of another illustrative display in the electronic device;

FIG. 8 is a front view of a wrist watch to which the present invention is applied;

FIG. 9 is a cross-sectional view taken along the line A—A of FIG. 8;

FIG. 10 is a cross-sectional view taken along the line B—B of FIG. 8;

FIG. 11 is a block diagram of a control unit;

FIG. 12 is a front view of the wrist watch in a display operation;

FIG. 13 is a front view of the wrist watch in another display operation; and

FIG. 14 is a front view of the wrist watch in still another display operation.

DETAILED DESCRIPTION OF THE PREFERRED EMBODIMENTS

Figure 1:
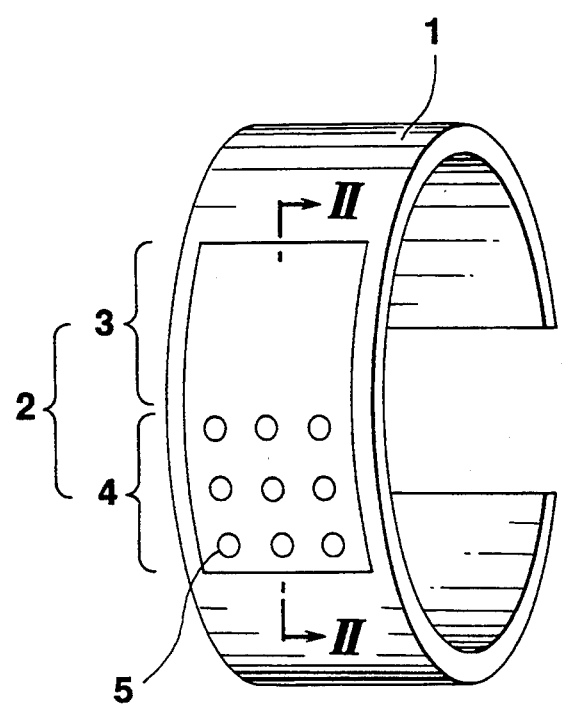
FIGS. 1-6 show a first embodiment of the present invention.

The present invention will be described specifically with respect to embodiments thereof shown in the drawings. The same element in the respective embodiments is identified with the same reference numeral, and further duplicate description thereof will be omitted.

FIRST EMBODIMENT

FIGS. 1-6 shows a first embodiment of the present invention. As shown in FIG. 1, the first embodiment takes the form of an electronic device which is provided with a split ring-like casing 1, and a panel 2 provided on the casing 1 for display of data on the panel 2 and input of data to the panel. The casing 1 is made of a flexible resin molding and worn on a wrist of the user like a wrist watch by its expansion. This improves portability and facilitates handling. The panel 2 extends along part of the periphery of the casing 1 and includes a display section 3 in a forward peripheral half of the panel 2 and an operation section 4 in the backward peripheral half of the panel 2 with operation buttons 5 arranged in order therein.

Figure 2:
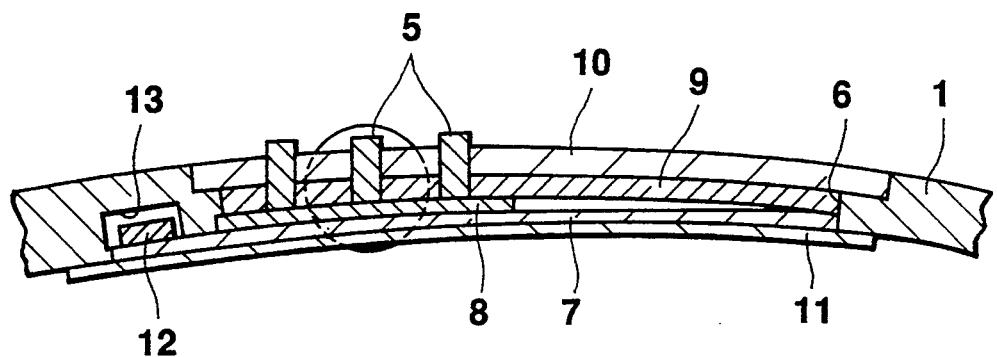

FIG. 2 is a cross-sectional view taken along the line II—II of FIG. 1. The casing 1 has a multi-stepped opening 6 within which a circuit board 7, a switch member 8, a film liquid crystal display member 9 and a transparent cover 1 are disposed in this order from below. Reference numeral 11 denotes a back cover bonded to the back of the casing 1 to close the opening 6 from below.

Figure 3:
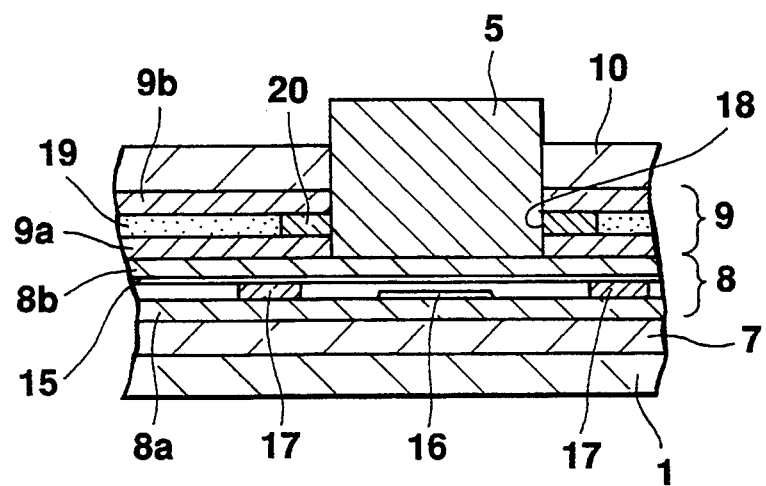

FIG. 3 is an enlarged view of a circled portion of FIG. 2. The internal structure of the electronic device will be described below with respect to those Figures. The circuit board 7 is made of a flexible material. It is provided with a control unit 12 made of an LSI and which controls the overall electronic device and a power source (batteries) (not shown) provided at predetermined positions thereon. In FIG. 2, reference numeral 13 denotes a concavity provided in the casing 1 for receiving the control unit 12. The circuit board 7 is connected electrically at an end (not shown) to the switch member 8 to feed a switching signal from the switch 8 to the control unit 12. The film liquid crystal display member 9 is kept at its back in partial contact with the circuit board 7 to thereby connect the board 7 to the display member 9 electrically such that a display signal is fed from the control unit 12 to the display member 9.

As shown in FIG. 3, the switch member 8 is composed of a pair of upper and lower flexible sheets 8a, 8b with a plurality of operation buttons 5 attached to an upper surface of the upper sheet 8b. A multiplicity of electrodes 15 extending in one direction is provided on a lower surface of the upper sheet 8b. A multiplicity of electrodes 16 extending in a direction (normal to the plane of FIG. 3) perpendicular to the direction in which the multiplicity of electrodes 15 extend is provided on an upper surface of the lower sheet 8a at a position opposite to the position of the operation buttons 5. The multiplicity of buttons 5 is provided at the position where the multiplicity of electrodes 15 intersects with the multiplicity of electrodes 16. When any particular operation button 5 is depressed, the corresponding electrodes 15 and 16 come into contact with each other to output a signal indicative of that contact to the control unit 12. The flexible sheets 8a, 8b have an insulating spacer 17 therebetween such that when the depressing force on the button 5 is released, the electrodes 15, 16 are moved away from each other to be put in a non-contact state.

Figure 4:
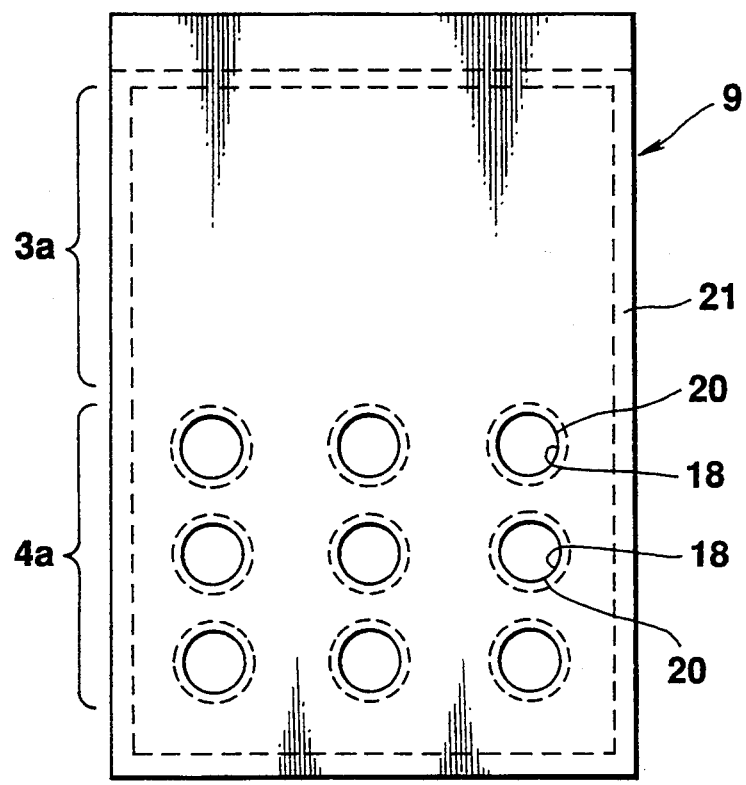

The film liquid crystal display member 9 is superimposed on the switch member 8 and has through holes 18 through which the corresponding buttons 5 extend at a position corresponding to the position of the operation section 4 in the liquid crystal display member 9. The overall display member 9 takes the form of a film and is composed of a pair of upper and lower flexible sheets 9a, 9b each having a polarizing plate (not shown) provided on an outer surface thereof, and a liquid crystal material 19 disposed between the sheets 9a and 9b. The flexible sheets 9a, 9b have corresponding electrodes (not shown) formed on opposite surfaces thereof. FIG. 4 is a plan view of the display member 9 where an upper half of FIG. 4 shows a display 3a which displays information visually with characters while a lower half of FIG. 4 shows an operation unit 4a where through the operation buttons 5 each extend through a through hole 18 in and is supported slidably by a spacer 20 which is placed between and along the peripheral portions of the sheets 9a, 9b. A circumferential spacer 20 is also provided between the flexible sheets 9a, 9b so as to cooperate with the spacers 21 to maintain a predetermined space between the sheets 9a, 9b. The transparent cover 10 is made of transparent glass or synthetic resin to cover the overall display member 9. Thus, information displayed on the display 3a of the film liquid crystal display member 9 can be viewed externally and the display member 9 is protected.

Figure 5:
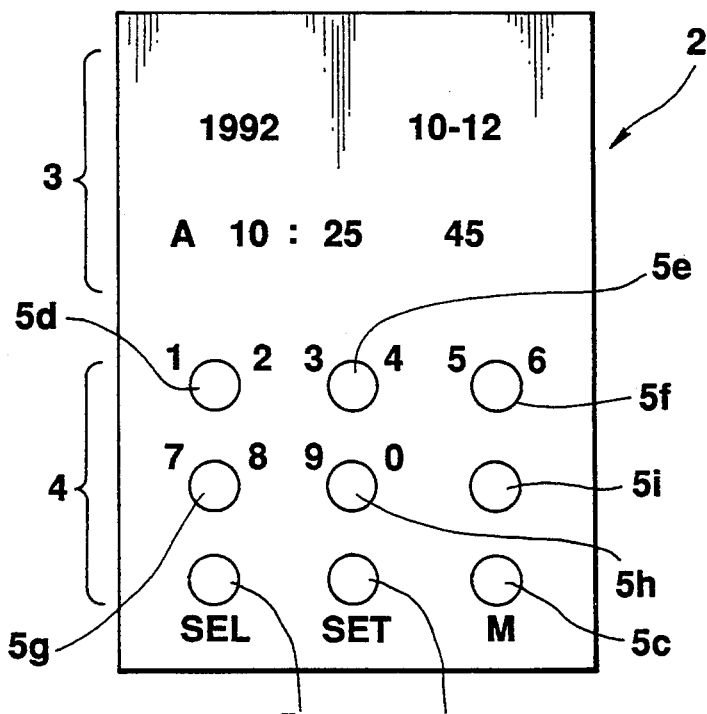
Figure 6:
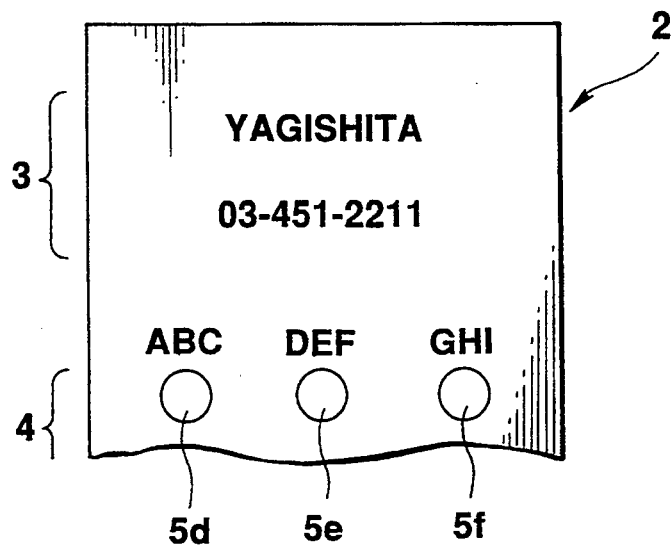

FIGS. 5 and 6 show illustrative display of the panel 2 of the present embodiment. Of the plurality of operation buttons 5 provided in the operation section 4 of the embodiment, the operation buttons 5a, 5b and 5c in a lower row are a place selection key, a setting key, and a mode switching key, respectively. In order to indicate the respective functions of those buttons, the corresponding function indications are printed at appropriate positions on the transparent cover 10. Operation buttons 5d, 5e, 5f, 5g, 5h, 5i in an upper and an intermediate row are keys for inputting a numerical value and a character, respectively. Selection of one of the input modes by those buttons 5a-5i except the button 5c is performed by operating the button 5c. For example, when the button 5c is depressed once, a date and time are displayed on the display 3, as shown in FIG. 5. This embodiment can take the form of an electronic wrist watch. In this case, the casing 1 corresponds to a watch case and a band. Along with the display of such date and time, the numerals "1" and ¢2" are indicated near the button 5d; the numerals "3" and "4" are indicated near the button 5e; and proper numerals are indicated near each of other buttons 5f, 5g and 5h. Those indications can be used as aims for numerical values for the user to input. For example, when "1"0 is to be input, the button 5a is depressed once; when "2" is to be input, the button 5b is depressed twice. When the button 5c is depressed twice, a data bank mode is selected so that the person's name "YAGISHITA" and his telephone number "03-451-2211" are displayed on the display 3, as shown in FIG. 6. In this mode, the characters "A", "B", "C" are displayed near the button 5d; the characters "D", "E", "F" are displayed near the button 5e; and proper other characters are displayed near the corresponding buttons 5f, 5g, 5h and 5i so that the user can input characters using those buttons 5d-5i. Display of numerical values and characters near the buttons in the above modes is made in the film liquid crystal display member 9. Thus, liquid crystal members 19 (FIG. 3) around the through holes 18 through which the buttons 5 extend constitute optical display means which makes such display.

In such embodiment, the operation buttons 5 of the switch member 8 extend through the film liquid crystal display member 9, as mentioned above. Since the display member 9 is thin, the overall device is thin in thickness. Thus, designability of the device is improved and handling of the device is facilitated.

SECOND EMBODIMENT

Figure 7:
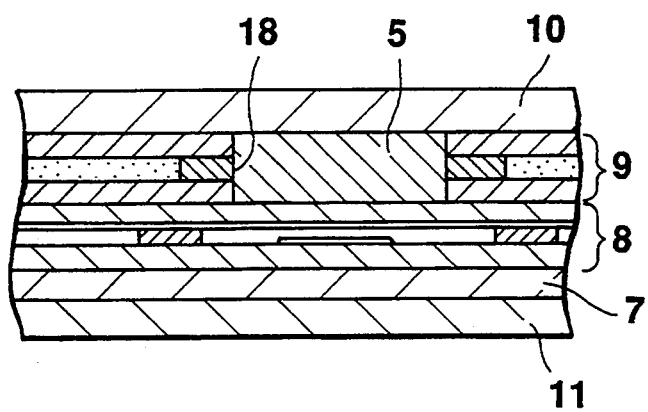
FIG. 7 is a partial cross-sectional view of a second embodiment of the present invention.

FIG. 7 shows a second embodiment of the present invention which also takes the form of a wrist watch. While in the present embodiment the operation buttons 5 of the switch member 8 extend through holes 18 in the film liquid crystal display member 9, they are covered with the transparent cover 10 without extending through the cover 10. The cover 10 is made of a flexible transparent acrylic resin. By depressing those portions of the cover 10 corresponding to the positions of the buttons 5, information is input to the device. Since in the present embodiment the transparent cover 10 covers the overall display member 9, the device has waterproofness, and no protruding state of the buttons appears to thereby improve the appearance of the device.

While in the embodiments the electronic devices of the type worn on a wrist of the user have been described, various changes and modifications are possible. For example, the present invention are similarly applicable to card- and desk top-type electronic devices.

THIRD EMBODIMENT

Figure 8:
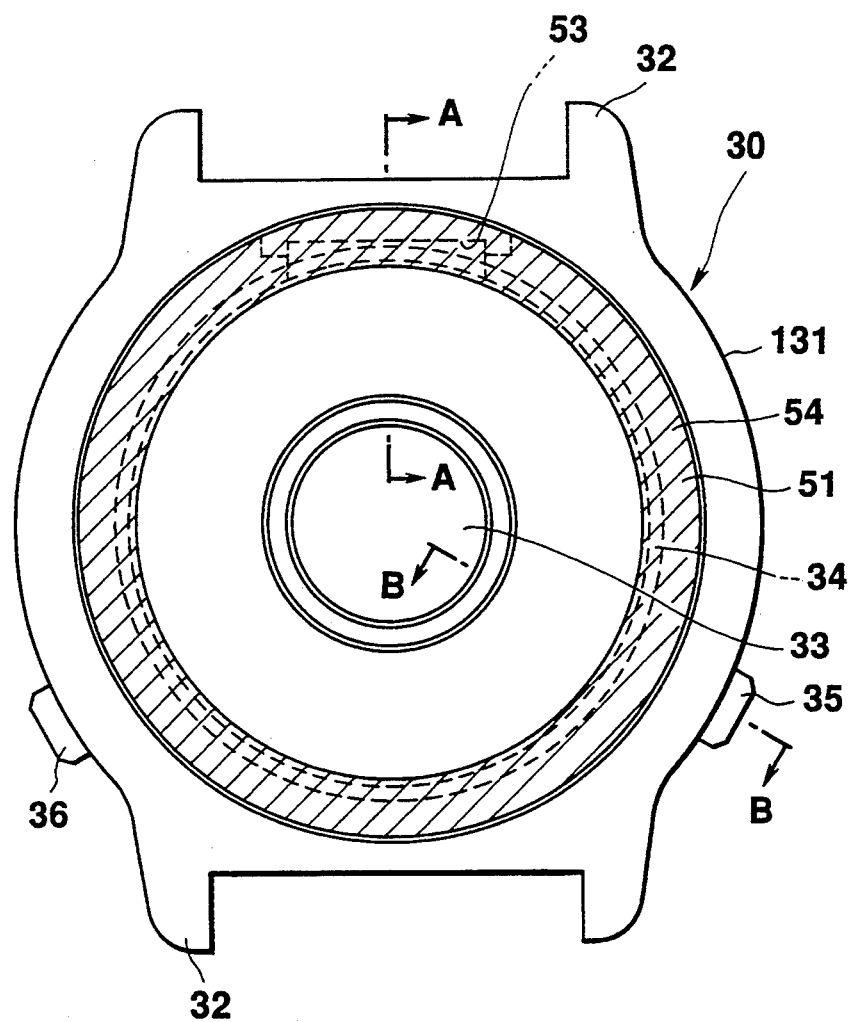
FIGS. 8-14 show a third embodiment of the present invention.
Figure 9:
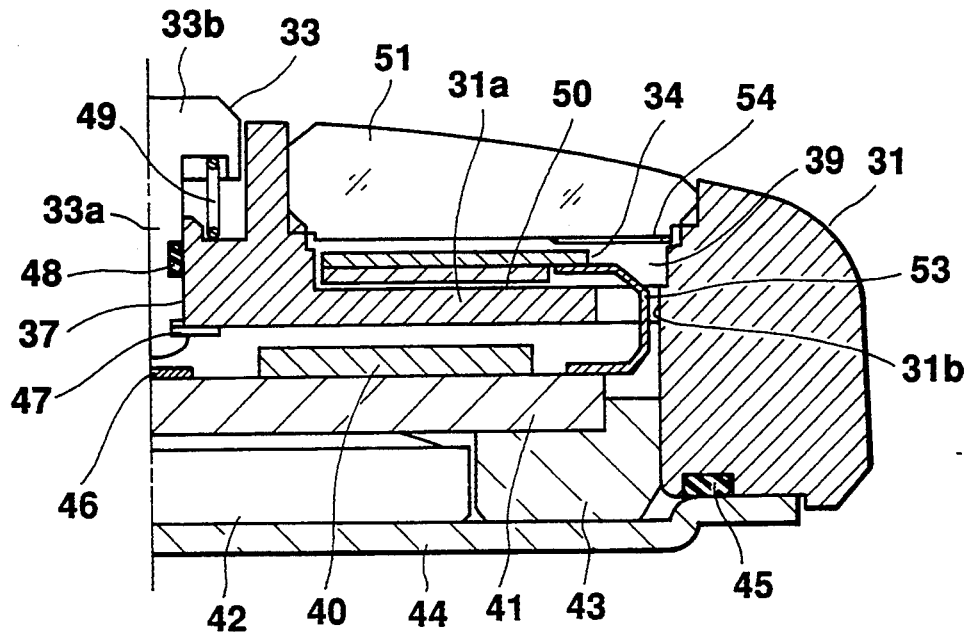
Figure 10:
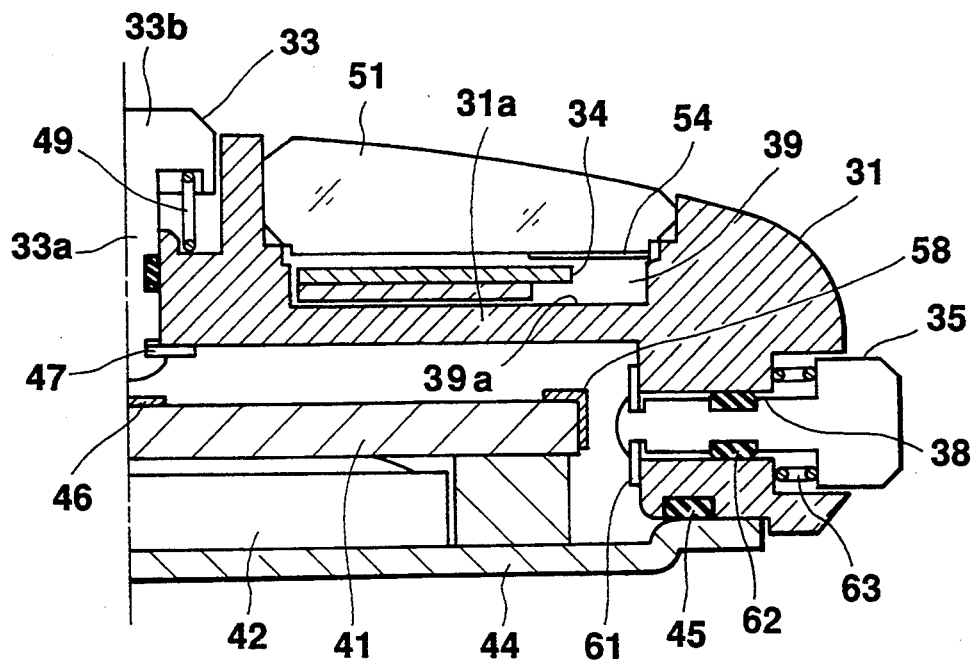

FIGS. 8–14 show a third embodiment of the present invention. FIG. 8 is a front view of the third embodiment which takes the form of a wrist watch 30. FIGS. 9 and 10 are cross-sectional views taken along the lines A—A and B—B, respectively, of FIG. 8. The watch casing 31 has band attachments 32 provided at opposite sides of the casing 31, and an operation button 33 provided at the center of an upper portion of the casing 31 with the operation button 33 extending through a film liquid crystal display member 34. The casing 31 has operation sub-buttons 35, 36 on its side.

As shown in FIGS. 9, 10, the casing 31 has through holes 37, 38 in an upper central portion and side thereof with an operation button 33 extending through the hole 37 and operation sub-buttons 35, 36 extending through the corresponding side holes 38.

The casing 31 has a horizontal partition 31a which partitions the inside of the casing into upper and lower spaces. Formed above the partition 31a is a donut-like concavity 39 having a flat bottom 39a. A clock module is disposed below the partition 31a. The clock module is composed of a control unit 40 made of an LSI and which controls the overall wrist watch, a circuit board 41 on which the control unit 40 is provided, a battery 42 which feeds power to the circuit board 41, and a synthetic resin internal housing 43 in which the circuit board 41 and battery 42 are provided. In this case, the control unit 40 delivers a display signal which controls the display on the film liquid crystal member 34 to the liquid crystal member 34 through printed leads provided on the circuit board 41 and a connecter 53 to be described in more detail later. The control unit 40 and the circuit board 41 compose an electronic circuit which controls the display on the film liquid crystal display member 34. In FIGS. 9 and 10, reference numeral 44 denotes a back cover attached to a lower surface of the casing 31; and 45, a hermetically sealing ring inserted between the back cover 44 and the lower surface of the casing 31.

As shown in FIGS. 9 and 10, the operation button 33 is composed of a stem 33a and an operation portion 33b provided integral with an upper end of the stem 33a, which is inserted slidably in a through hole 37 provided at an upper center of the casing 31. The operation portion 33b is flush with, or higher somewhat than, the upper end surface of the casing 31. Depression of the operation portion 33b moves the stem 33a downward as a unit to thereby perform a switching operation. To this end, a switch member 46 is provided at a position on an upper surface of the circuit board 41 opposite to the stem 33a of the operation button 33. The operation button 33 is prevented from slippage out of the casing 31 by a slippage preventive ring 47 such as an E-like ring provided at an lower end of the stem 33a with a seal ring 48 being provided between the stem 33a and the inner surface of the through hole 37 for maintaining airtightness. The operation portion 33b of the operation button 33 takes the form of a head having a larger diameter than the stem 33a with a spring 49 which presses the operation button 33 upward being provided between the lower surface of the head and the upper surface of the casing 31. Since the operation button 33 is provided in the upper portion of the casing 31, operation is easy. It is used as an operation switch which is operated frequently, for example, as a timer switch.

The film liquid crystal member 34 is bonded with an adhesive 50 to the partition 31a of the casing 31 so as to be maintained in a flat state. The liquid crystal member 34 takes the form of a donut and is disposed within the concavity 39 in the casing 31 which also takes the form of a donut. As shown in FIG. 8, the liquid crystal member 34 is disposed around and concentrically with the operation button 33. A donutlike transparent or watch glass cover 51 is fitted over the liquid crystal member 34 in the concavity 39 for protective purposes. The liquid crystal member 34 is connected electrically through a flexible sheet-like connector 53 to the circuit board 41 to control the display, as shown in FIGS. 9 and 10. The connecter 53 is joined at opposite ends by heat seal or soldering to the electrodes of the film liquid crystal member 34 and of the circuit board 41 for connecting purposes. Reference numeral 31b denotes a slit provided in the partition 31a through which the connector 53 extends. The display region of the liquid crystal member 34 is its overall area except for its outer peripheral portion including the joined portion of the connecter 53 and which is a non-display region. In order to cover the non-display region, the outer lower peripheral surface of the watch Glass 51 is covered with a mask film 54 by printing. By causing the mask film 54 to have a metallic or different color, an ornament is formed on the outer peripheral portion of the display region to thereby increase its beauty.

Since the film liquid crystal member 34 is provided around the button 33 in the wrist watch of such structure, it provides a novel design to increase the degree of taste. Design of a large operation button 33 is easy to thereby increase the degree of freedom of design as well as the operability of the button 33.

As shown in FIG. 10, the operation sub-buttons 35, 36 provided on the side of the casing 31 are inserted slidably within the through holes 38 in the casing 31 and each have a slippage preventive ring 61 provided at its inner end for prevention of slippage of the sub-button out of the hole, and an airtight seal ring 62 provided between the inner wall surface of the through holes 38 and the outer middle portion of the corresponding sub-button, and are biased outward of the casing 31 by a spring 63. Since the operation sub-button 35, 36 are provided on the side of the casing 31, they are used as operation switches for setting a mode which is not so often used or switching the mode. In FIG. 10, reference numeral 58 denotes sub-switch members provided on the side of the circuit board 41 opposite to the operation sub-buttons 35, 36 and switched by pushing the sub-buttons 35, 36.

Figure 11:
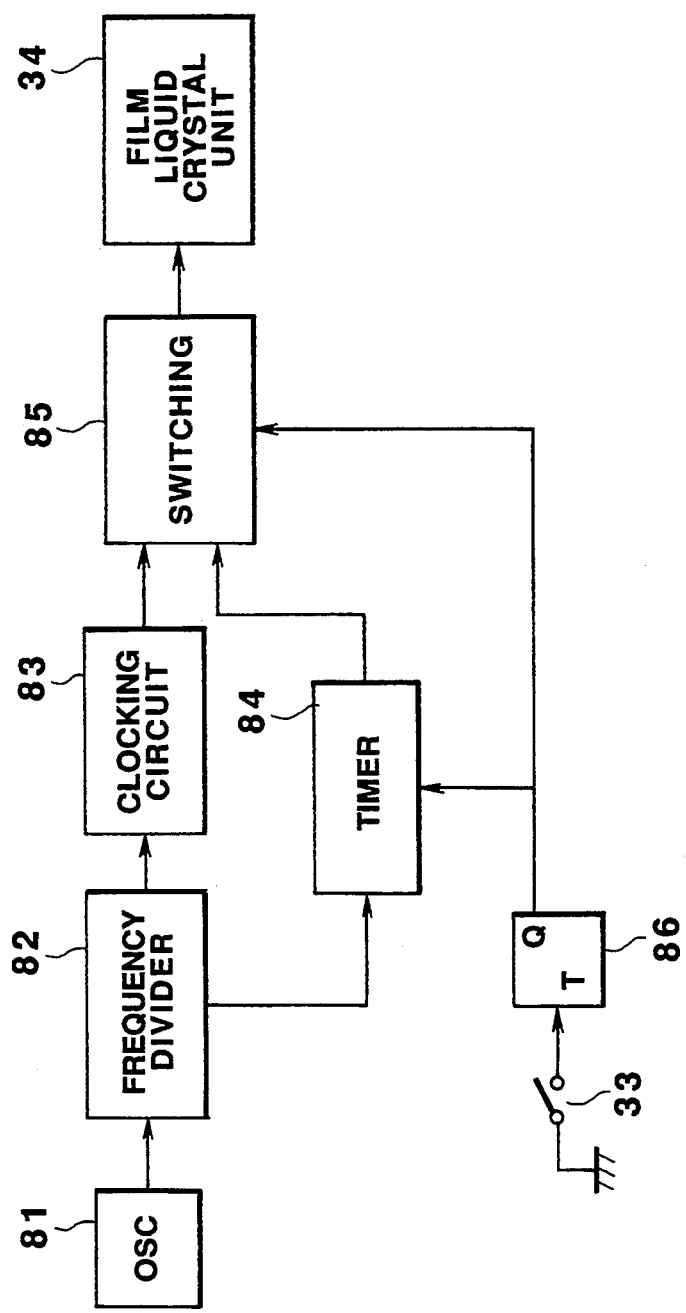

FIG. 11 shows the circuit structure of the control unit 40 composed of an oscillator 81 which generates a reference frequency pulse which is used as a reference for a clocking operation, a frequency divider 82 which divides the reference frequency generated by the oscillator 81, a clocking circuit 83 which indicates the current time on the basis of the pulse signals obtained from the divider 82, a timer 84 which sets time on the basis of pulse signals from the frequency divider 82, and a switching unit 85 which selects one of signals from the clocking circuit 83 and the timer 8 and outputs the selected signal to the film liquid crystal member 34. When the operation button 33 is used as a timer switch, it is connected to a triggering terminal T of a flip-flop 86 which takes from the terminal T a signal generated by the switching operation of the operation button 33 and outputs a high level signal from its Q terminal to the timer 84 and the switching unit 85. The timer 84 starts its clocking operation in response to the signal of the high level signal from the Q terminal. In response to the high level signal, the switching unit 85 selects the output from the timer 84 in place of the output which the clock circuit 83 has provided so far and delivers the timer output to the film liquid crystal member 34.

Figure 12:
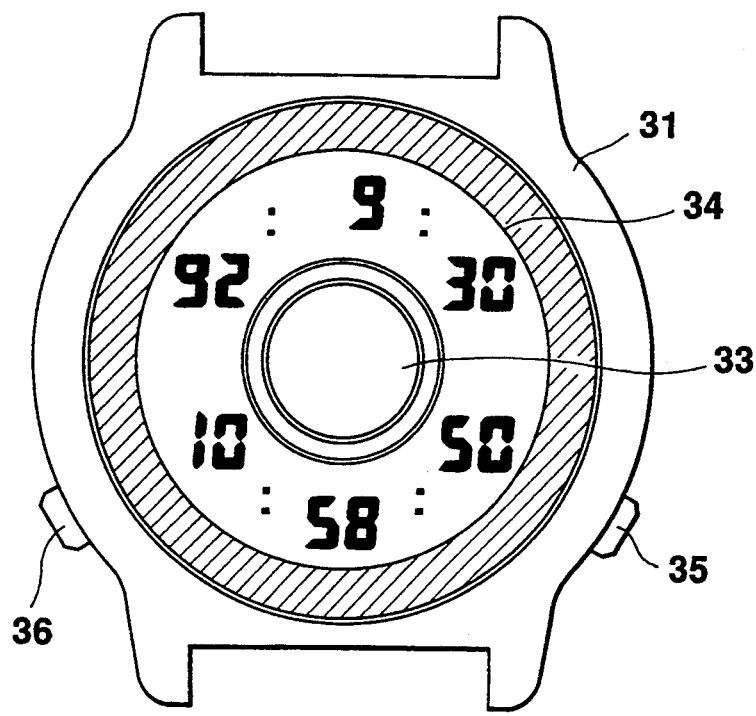
Figure 13:
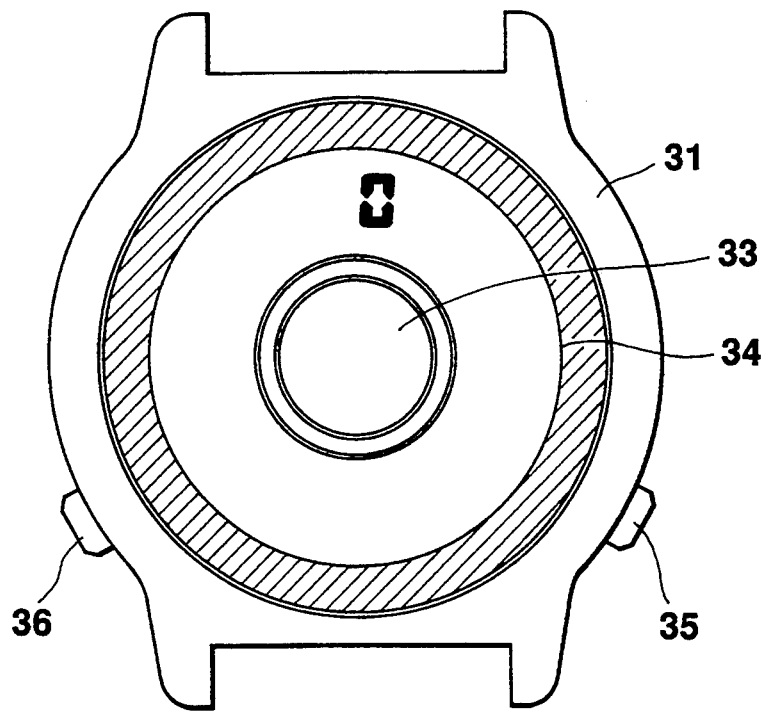
Figure 14:
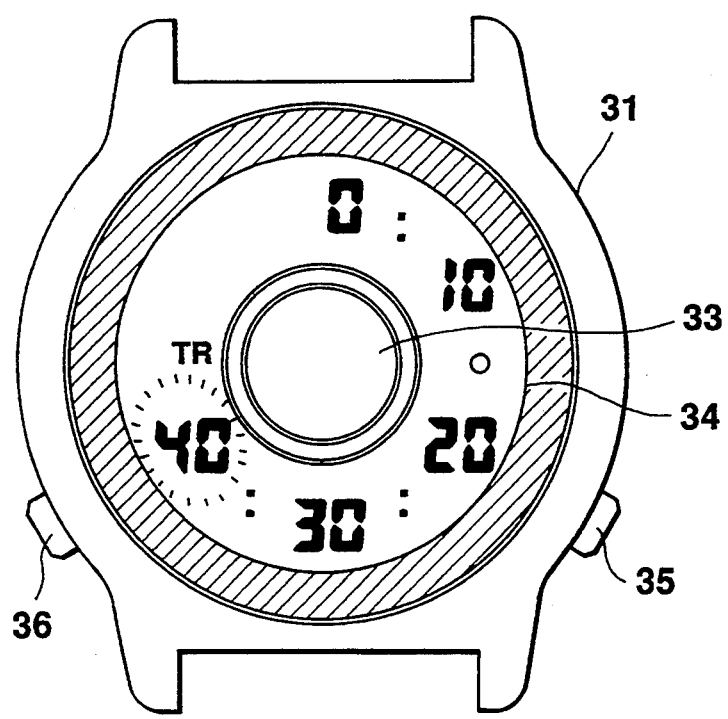

The operation buttons 35, 36 (FIGS. 12, 13) operate as a switch which corrects the time of the clocking circuit 83 or as a reset switch for the timer 84. FIG. 12 shows a regular mode which displays a date and time. In FIG. 12, it displays $10^h\ 58^m\ 50^s$, Sep. 30, 1992. By depression of the button 33 in this mode, a timer mode of FIG. 13 starts in which the timer 84 starts to perform a timing operation. As shown in FIG. 14, the timer set time sequentially comes along while going on/off. When the operation button 33 is again depressed in such going-on/off state, a mode which displays a date and time is recovered. Since frequent switching operations are performed by the operation button 33 provided at the upper center of the casing 31, operability is improved and a reliable operation is ensured.

The present invention is not limited to the above embodiments. Various changes and modification are possible. For example, the film crystal display member may take the form of a polygonal ring such as a triangular or a rectangular ring. The operation button 33 may be used for switching operations other than that of the timer switch.

What is claimed is:

1. An electronic device comprising:
    a device casing having a through hole therein;
    an operation button disposed in the through hole in said casing;
    a switch member disposed below said operation button and switched by a depression of said button; and
    a film liquid crystal display unit disposed around the periphery of said operation button and having the contents of display thereof controlled by the switching operation of said switch member.

2. An electronic device according to claim 1, wherein said through hole is provided at substantially the center of the overall device casing.

3. An electronic device according to claim 1, wherein said through hole is provided at substantially the center of the overall device casing, and comprising a ring-like flat region extending around the through hole with said film liquid crystal display unit being disposed on the ring-like flat region.

4. An electronic device according to claim 1, wherein said through hole is provided at substantially the center of the overall device casing, and comprising a ring-like flat region extending around the through hole with said film liquid crystal display unit being disposed on the ring-like flat region, and a transparent cover disposed above said film crystal display unit.

5. An electronic device according to claim 1, comprising a circuit board having said switch member disposed thereon and disposed below said operation button; and a connector connected to the circuit board for delivery of a display signal to the film liquid crystal display unit.

6. An electronic device according to claim 1, wherein said film liquid crystal display unit comprises two opposite flexible baseplates, display electrodes formed on opposite inner surfaces of said flexible baseplates, and a liquid crystal material confined between said two flexible baseplates.

7. An electronic device with a liquid crystal display, comprising:
    a device casing with a plurality of through holes therein;
    a like number of operation buttons disposed in the corresponding plurality of through holes in said device casing;
    a switch member disposed below the plurality of operation buttons and switched by a depression of said buttons; and
    a film liquid crystal display unit disposed above said switch member and around said operation buttons with the contents of display of said liquid crystal display unit being controlled by switching operations of said switch member.

8. An electronic device according to claim 7, wherein said device casing is made of a transparent material with the plurality of through holes therein.

9. An electronic device according to claim 7, wherein said device casing comprises a casing body which receives said switch member and said film liquid crystal display unit, and a transparent cover attached to said casing body and having the plurality of through holes therein.

10. An electronic device according to claim 7, wherein said switch member comprises a flexible sheet on which a plurality of switch contacts is formed in correspondence to the plurality of operation buttons.

11. An electronic device according to claim 7, wherein said film liquid crystal display unit comprises means for displaying functions of said operation buttons.

12. An electronic device with a liquid crystal display, comprising:
    a plurality of operation members;
    a switch member disposed below said plurality of operation members and switched by depression of said respective operation members; and
    a film liquid crystal display unit disposed above said switch member and around said operation members with the contents of display of said liquid crystal display unit being controlled by switching operations of said operation members; and
    a transparent cover disposed above said film liquid crystal display unit and having operation portions of said operation members disposed therein.

13. An electronic device according to claim 12, wherein said switch member comprises a common flexible sheet on which a plurality of switch contacts is formed in correspondence to said plurality of operation members.

14. An electronic device according to claim 12, wherein the operating members are depressed through the corresponding operation portions thereof in said transparent cover.

15. An electronic device according to claim 12, comprising a clock casing to which said transparent cover is attached and wherein the operating members, switch member and film liquid crystal display unit are received within said clock casing.

16. An electronic device according to claim 12, wherein the film liquid crystal display unit comprises means for displaying functions of said operation members.

* * * * *